(12) United States Patent
Okamoto et al.

(10) Patent No.: US 6,813,210 B2
(45) Date of Patent: Nov. 2, 2004

(54) SEMICONDUCTOR MEMORY DEVICE REQUIRING REFRESH OPERATION

(75) Inventors: Takeo Okamoto, Hyogo (JP); Tetsuichiro Ichiguchi, Hyogo (JP); Hideki Yonetani, Hyogo (JP); Tsutomu Nagasawa, Hyogo (JP); Tadaaki Yamauchi, Hyogo (JP); Makoto Suwa, Hyogo (JP); Junko Matsumoto, Hyogo (JP); Zengcheng Tian, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 79 days.

(21) Appl. No.: 10/300,591

(22) Filed: Nov. 21, 2002

(65) Prior Publication Data

US 2003/0218931 A1 Nov. 27, 2003

(30) Foreign Application Priority Data

May 22, 2002 (JP) ........................................ 2002-147969

(51) Int. Cl.[7] .............................................. G11C 7/00
(52) U.S. Cl. ........................................ 365/222; 365/233
(58) Field of Search ................................... 365/222, 233

(56) References Cited

U.S. PATENT DOCUMENTS 4,125,873 A * 11/1978 Chesarek .................... 345/555

FOREIGN PATENT DOCUMENTS

| JP | 05-6663 | | 1/1993 | |
| JP | 5-6663 | * | 5/1993 | ......... G11C/11/406 |
| JP | 08-279287 | | 10/1996 | |
| JP | 08279287 A | * | 10/1996 | ......... G11C/11/406 |
| JP | 09204773 A | * | 5/1997 | ......... G11C/11/406 |
| JP | 09-171682 | | 6/1997 | |
| JP | 09171682 A | * | 6/1997 | ......... G11C/11/401 |
| JP | 09-204773 | | 8/1997 | |
| JP | 2001-143465 A | | 5/2001 | |
| JP | 2001143465 A | * | 5/2001 | ......... G11C/11/403 |
| JP | 2001-184860 A | | 7/2001 | |

* cited by examiner

*Primary Examiner*—M. Tran
(74) *Attorney, Agent, or Firm*—McDermott, Will & Emery

(57) ABSTRACT

The semiconductor memory device includes a refresh timer for determining a refresh cycle of self-refresh operation. The refresh timer includes a voltage regulator, a ring oscillator and a counter. The voltage regulator generates a bias voltage having positive temperature characteristics. The ring oscillator varies an oscillation cycle of a pulse signal according to the bias voltage. The counter counts a prescribed number of pulse signals and generates a refresh signal for executing refresh operation. The semiconductor memory device thus varies the refresh cycle according to a temperature change, and executes refresh operation with an appropriate refresh cycle.

7 Claims, 11 Drawing Sheets

F I G. 1
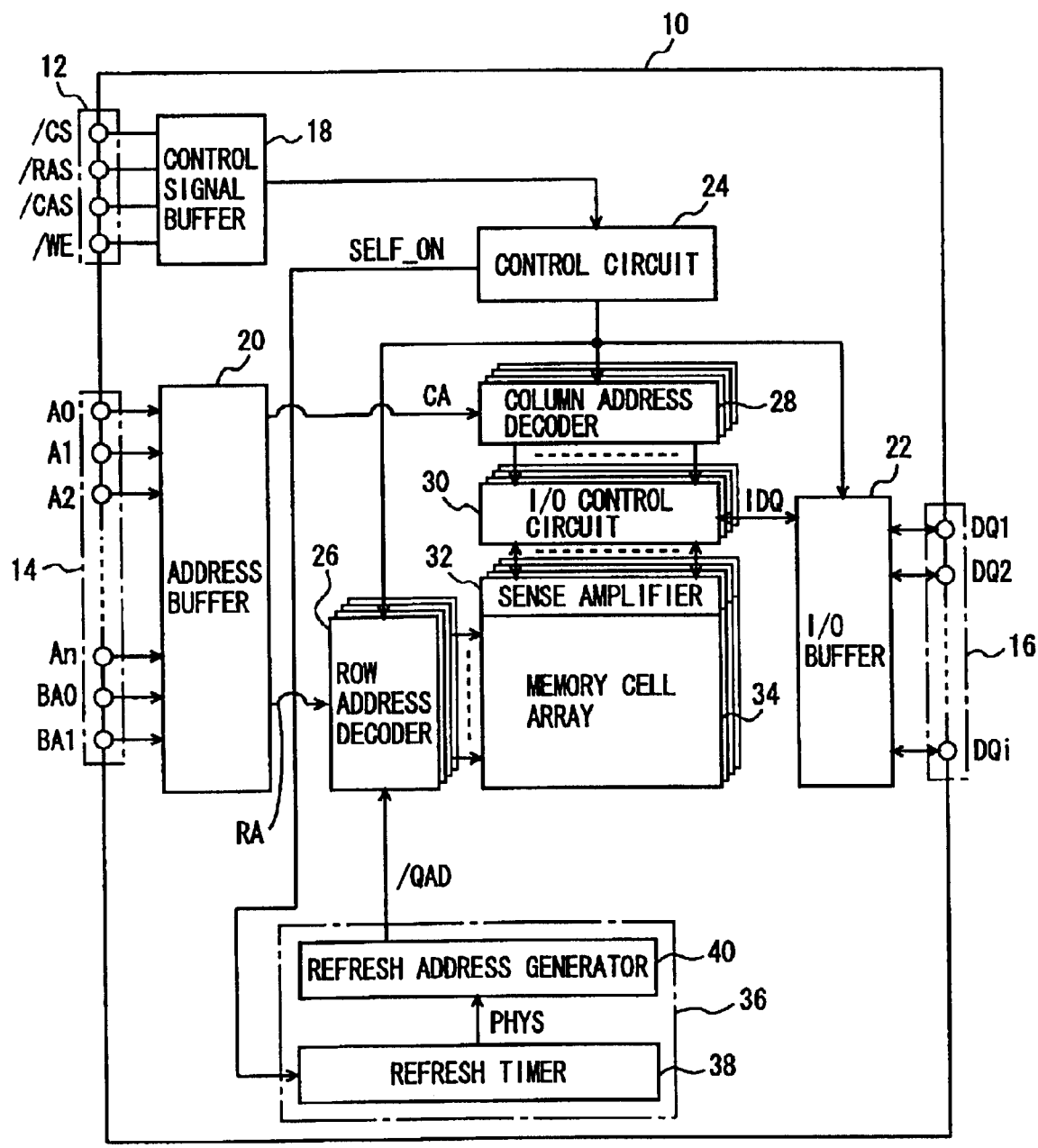

SEMICONDUCTOR MEMORY DEVICE REQUIRING REFRESH OPERATION

BACKGROUND OF THE INVENTION

1. Field of the Invention

The present invention generally relates to a semiconductor memory device. More particularly, the present invention relates to a semiconductor memory device requiring refresh operation.

2. Description of the Background Art

Recent reduction in size and power consumption of electronic equipments causes strict requirement for reduced power consumption of the semiconductor memory devices to be mounted to such electronic equipments. A DRAM (Dynamic Random Access Memory), one of a representative example of semiconductor memory devices, requires refresh operation for holding storage data. Therefore, power consumption can be significantly reduced by conducting refresh operation with an appropriate cycle.

In order to hold the storage data of the DRAM, the DRAM conducts refresh operation by reading, amplifying and rewriting the data in a periodic manner in each memory cell to be refreshed. In general, in the refresh operation, every memory cell connected to the word line selected by a row address is refreshed simultaneously.

The conventional DRAM has a self-refresh mode, a mode for holding storage data, as a stand-by mode corresponding to a battery backup period and the like. In the self-refresh mode, the DRAM automatically generates a row address and automatically selects a word line for refresh operation. The DRAM conducts refresh operation in refresh cycle according to a refresh signal that is periodically generated by an internal refresh timer.

The refresh cycle for refresh operation is determined by the time period for which the memory cells can hold the data, that is, the data holding time. The data holding time is dependent on a leak current of the memory cell. In a memory cell that is sensitive to temperature change, the leak current becomes less than three orders higher as the temperature increases by 100° C. Therefore, the refresh cycle must be appropriately determined according to the temperature.

The conventional DRAM cannot appropriately regulate the refresh cycle of the self-refresh operation according to temperature change. In order to ensure that the memory cells hold the storage data at high temperature, the conventional DRAM determines the refresh cycle according to the capability of the DRAM at high temperature. Therefore, the refresh operation is conducted unnecessarily frequently at low temperature, thereby unnecessarily increasing power consumption of the refresh operation. Even for a DRAM having temperature-dependent circuitry, it is difficult to internally regulate the refresh cycle to a desired cycle at both high temperature and low temperature. Note that "high temperature" generally refers to a temperature in the range of 70 to 80° C. or higher, and "low temperature" refers to room temperature or a temperature below room temperature.

As described above, the refresh cycle of the self-refresh operation must be appropriately determined so as to ensure that the memory cells hold the storage data and to prevent excessive power consumption. Therefore, a regulator regulates the refresh cycle of the self-refresh operation according to the capability of the semiconductor memory device. In order to regulate the refresh cycle, it is necessary to measure the refresh cycle.

However, it is difficult for the conventional DRAM to measure the refresh cycle even if it has circuitry for measuring the refresh cycle in the self-refresh operation. For example, this is because the refresh cycle must be measured with a waveform measuring device such as oscilloscope being connected to a terminal that is not used normally, or because there is no appropriate waveform measuring device, or connection of the waveform measuring device is troublesome.

SUMMARY OF THE INVENTION

It is an object of the present invention to provide a semiconductor memory device for varying a refresh cycle according to a temperature change and conducting refresh operation with an appropriate refresh cycle.

It is another object of the present invention to provide a semiconductor memory device capable of easily measuring a refresh cycle of self-refresh operation.

According to a first aspect of the present invention, a semiconductor memory device includes a memory cell array including a plurality of memory cells arranged in a matrix, and a refresh control circuit periodically executing refresh operation in order to hold information stored in the plurality of memory cells. The refresh control circuit includes a refresh timer determining a refresh cycle and generating a refresh signal in the refresh cycle, and a refresh address generator sequentially generating, in response to the refresh signal, a refresh row address designating a row of memory cells to be subjected to the refresh operation. The refresh timer includes a voltage regulator regulating an output voltage according to reduction in temperature by using a differential amplifier, an oscillator receiving the output voltage from the voltage regulator and generating an internal signal whose generation cycle is increased with reduction in the output voltage, and a refresh signal generator generating the refresh signal based on the internal signal.

In the first aspect of the present invention, the voltage regulator is formed from the differential amplifier that operates according to a temperature change, and the refresh timer increases the refresh cycle with reduction in temperature based on the output voltage from the voltage regulator.

Accordingly, the above semiconductor memory device executes refresh operation with an appropriate, stable refresh cycle from high temperature to low temperature, thereby enabling reduction in power consumption required for refresh operation.

Preferably, the voltage regulator outputs a constant output voltage when a temperature is less than a prescribed value.

Preferably, the voltage regulator includes a first constant current circuit, a second constant current circuit, a temperature correction circuit, and a bias voltage output circuit. The first constant current circuit outputs a first voltage based on a resistance value of a first resistor having first temperature characteristics. The second constant current circuit outputs a second voltage based on a resistance value of a second resistor having positive second temperature characteristics that have a temperature gradient greater than that of the first resistor. The temperature correction circuit compares the second voltage with the first voltage, and outputs a third voltage having positive temperature characteristics based on the comparison result. The bias voltage output circuit converts the third voltage for a match to temperature characteristics of the refresh cycle, and outputs the output voltage.

According to a second aspect of the present invention, a semiconductor memory device includes a memory cell array including a plurality of memory cells arranged in a matrix, a refresh control circuit periodically executing refresh operation in order to hold information stored in the plurality of memory cells, a measuring circuit generating a measurement signal in response to a first command applied to the semiconductor memory device in a refresh cycle measuring mode, and an output circuit for outputting the measurement signal to outside. The refresh control circuit includes a refresh timer determining a refresh cycle and generating a refresh signal in the refresh cycle, and a refresh address generator sequentially generating, in response to the refresh signal, a refresh row address designating a row of memory cells to be subjected to the refresh operation. The refresh timer starts counting operation for generating the refresh signal in response to a second command applied to the semiconductor memory device in the refresh cycle measuring mode. The measuring circuit receives the refresh signal that is generated by the refresh timer after the refresh cycle based on the second command. The measuring circuit outputs the measurement signal having a first logic level to the output circuit when the measuring circuit receives the refresh signal before the first command. The measuring circuit outputs the measurement signal having a second logic level to the output circuit when the measuring circuit does not receive the refresh signal before the first command.

In the second aspect of the present invention, the measuring circuit generates a measurement signal in the refresh cycle measuring mode. This measurement signal has different logic levels according as whether the timing of receiving the refresh signal that is generated after the refresh cycle based on the second command is earlier or later than the timing of receiving the first command.

In the second aspect, the semiconductor memory device can easily measure the refresh cycle by measuring the time between the first and second commands when the logic level of the measurement signal is varied, while shifting the timing of applying the second command.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a schematic block diagram showing the overall structure of a semiconductor memory device according to a first embodiment of the present invention.

DESCRIPTION OF THE PREFERRED EMBODIMENTS

Figure 2:
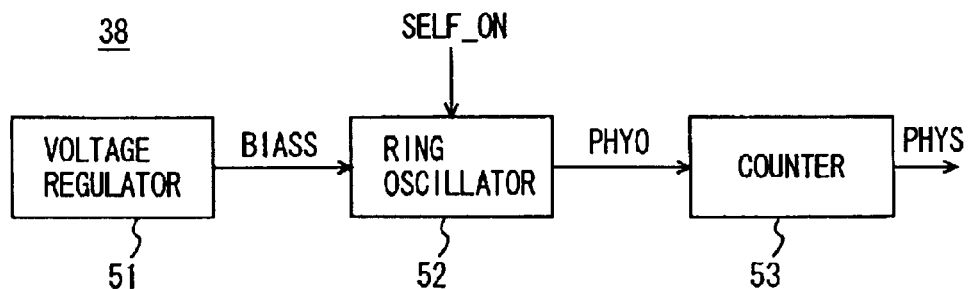
FIG. 2 is a functional block diagram illustrating functions of a refresh timer in FIG. 1.

Hereinafter, embodiments of the present invention will be described in detail with reference to the accompanying drawings. Note that the same or corresponding portions are denoted with the same reference numerals and characters, and description thereof will not be repeated.

First Embodiment

FIG. 1 is a schematic block diagram showing the overall structure of a semiconductor memory device according to the first embodiment of the present invention.

Referring to FIG. 1, a semiconductor memory device 10 includes a control signal terminal 12, an address terminal 14, and a data input/output (I/O) terminal 16. Semiconductor memory device 10 further includes a control signal buffer 18, an address buffer 20, and an input/output (I/O) buffer 22. Semiconductor memory device 10 further includes a control circuit 24, a row address decoder 26, a column address decoder 28, an input/output (I/O) control circuit 30, a sense amplifier 32, a memory cell array 34, and a refresh control circuit 36. Refresh control circuit 36 includes a refresh timer 38 and a refresh address generator 40.

Memory cell array 34, a memory element group, is formed from memory cells arranged in a matrix. Memory cell array 34 is formed from four banks capable of operating independently of each other. Four row address decoders 26, four column address decoders 28, four I/O control circuits 30 and four sense amplifiers 32 are provided corresponding to the four banks of memory cell array 34.

Control signal terminal 12 receives the following command control signals: a chip select signal/CS, a row address strobe signal/RAS, a column address strobe signal/CAS, and a write enable signal/WE. Control signal buffer 18 latches chip select signal/CS, row address strobe signal/RAS, column address strobe signal/CAS and write enable signal/WE from control signal terminal 12, and outputs the latched signals to control circuit 24.

Address terminal 14 receives address signals A0 to An (where n is a natural number) and bank address signals BA0, BA1. Address buffer 20 includes a row address buffer and a column address buffer, which are not shown in the figure. The row address buffer in address buffer 20 latches address signals A0 to An and bank address signal BA0, BA1 and outputs a row address signal RA to row address decoder 26 corresponding to the bank designated by bank address signals BA0, BA1. The column address buffer in address buffer 20 latches address signals A0 to An and bank address signals BA0, BA1 and outputs a column address signal CA to column address decoder 28 corresponding to the bank designated by bank address signals BA0, BA1.

Data I/O terminal 16 is a terminal for receiving and outputting read/write data of semiconductor memory device 10 from and to the outside. In write operation, data I/O terminal 16 receives external input data DQ0 to DQi (where i is a natural number). In read operation, data I/O terminal 16 outputs data DQ0 to DQi to the outside. In write operation, I/O buffer 22 latches data DQ0 to DQi and outputs internal data IDQ to I/O control circuit 30. In read operation, I/O buffer 22 outputs internal data IDQ received from I/O control circuit 30 to data I/O terminal 16.

Control circuit 24 controls row address decoder 26, column address decoder 28 and I/O buffer 22 based on the command control signals from control signal buffer 18. In self-refresh operation, control circuit 24 outputs a self-refresh activation signal SELF_ON to refresh timer 38.

Based on row address signal RA from address buffer 20, row address decoder 26 generates a signal RAD for selecting a word line on memory cell array 34. Row address decoder 26 decodes a row address based on signal RAD, and selects a word line on memory cell array 34 corresponding to the decoded row address. A not-shown word driver then activates the selected word line.

Column address decoder 28 decodes a column address based on column address signal CA from address buffer 20, and selects a bit line pair on memory cell array 34 corresponding to the decoded column address.

In write operation, I/O control circuit 30 outputs internal data IDQ received from I/O buffer 22 to sense amplifier 32. Sense amplifier 32 precharges a bit line pair selected by column address decoder 28 to a power supply voltage Vcc or a ground voltage GND according to the logic level of internal data IDQ. Internal data IDQ is then written to a memory cell connected to both the word line activated by row address decoder 26 and the bit line pair selected by column address decoder 28 and precharged by sense amplifier 32.

In read operation, sense amplifier 32 precharges a bit line pair selected by column address decoder 28 to a voltage Vcc/2, and detects a small voltage change that is generated on the selected bit line pair according to read data. Sense amplifier 32 then amplifies the detected small voltage change to determine the logic level of the read data, and outputs the read data to I/O control circuit 30. I/O control circuit 30 outputs the read data received from sense amplifier 32 to I/O buffer 22.

As described above, memory cell array 34 is formed from four banks capable of operating independently of each other. Each bank of memory cell array 34 is connected to a corresponding row address decoder 26 through word lines extending in the row direction, and also connected to a corresponding sense amplifier 32 through bit line pairs extending in the column direction.

In the self-refresh operation mode, refresh control circuit 36 generates a row address for refresh operation (hereinafter, referred to as refresh row address signal/QAD) and outputs refresh row address signal/QAD to row address decoder 26 according to the instruction from control circuit 24. In normal operation, row address decoder 26 selects a word line on memory cell array 34 based on row address signal RA from address buffer 20 according to the instruction from control circuit 24. In self-refresh operation, row address decoder 26 selects a word line on memory cell array 34 based on refresh row address signal/QAD from refresh control circuit 36.

Refresh timer 38 is activated in response to self-refresh activation signal SELF_ON from control circuit 24, and generates an internal pulse signal PHY0 having a cycle varied according to the temperature. Refresh timer 38 generates a refresh signal PHYS based on pulse signal PHY0 and outputs the generated refresh signal PHYS to refresh address generator 40. Refresh signal PHYS is activated in every prescribed refresh cycle. The prescribed refresh cycle is determined in view of the number of word lines on memory cell array 34 and the refresh interval which prevents refresh operation from being conducted unnecessarily frequently at low temperature and ensures that data is held in each memory cell of memory cell array 34.

Refresh address generator 40 updates a refresh row address according to refresh signal PHYS and sequentially switches a memory cell row to be subjected to refresh operation. More specifically, refresh address generator 40 increments refresh row address signal/QAD according to refresh signal PHYS.

FIG. 2 is a functional block diagram illustrating functions of refresh timer 38 in FIG. 1. Referring to FIG. 2, refresh timer 38 includes a voltage regulator 51, a ring oscillator 52 and a counter 53.

Voltage regulator 51 generates a temperature-dependent bias voltage BIASS for output to ring oscillator 52. More specifically, voltage regulator 51 reduces bias voltage BIASS with reduction in temperature, and outputs constant bias voltage BIASS at a prescribed temperature Ta or less. As described later in more detail, voltage regulator 51 outputs constant bias voltage BIASS at prescribed temperature Ta or less in order to ensure refresh operation at low temperature.

Ring oscillator 52 is an oscillation circuit for periodically generating pulse signal PHY0. Ring oscillator 52 varies a generation cycle of pulse signal PHY0 according to bias voltage BIASS from voltage regulator 51. More specifically, ring oscillator 52 increases the generation cycle of pulse signal PHY0 with reduction in bias voltage BIASS. Ring oscillator 52 is activated in response to self-refresh activation signal SELF_ON from control circuit 24.

Counter 53 counts a prescribed number of pulse signals PHY0 from ring oscillator 52. Counter 53 outputs refresh signal PHYS when the count value exceeds the prescribed value. Self-refresh operation is conducted according to refresh signal PHYS.

In refresh timer 38, voltage regulator 51 reduces bias voltage BIASS with reduction in temperature. Ring oscillator 52 increases an oscillation cycle of pulse signal PHY0 in response to bias voltage BIASS from voltage regulator 51. As a result, counter 53 outputs refresh signal PHYS with an increased cycle.

In order to ensure refresh operation at low temperature, voltage regulator 51 outputs constant bias voltage BIASS at prescribed temperature Ta or less. As a result, the maximum refresh cycle at low temperature is determined, whereby refresh operation is ensured even at an extremely low temperature.

Figure 3:
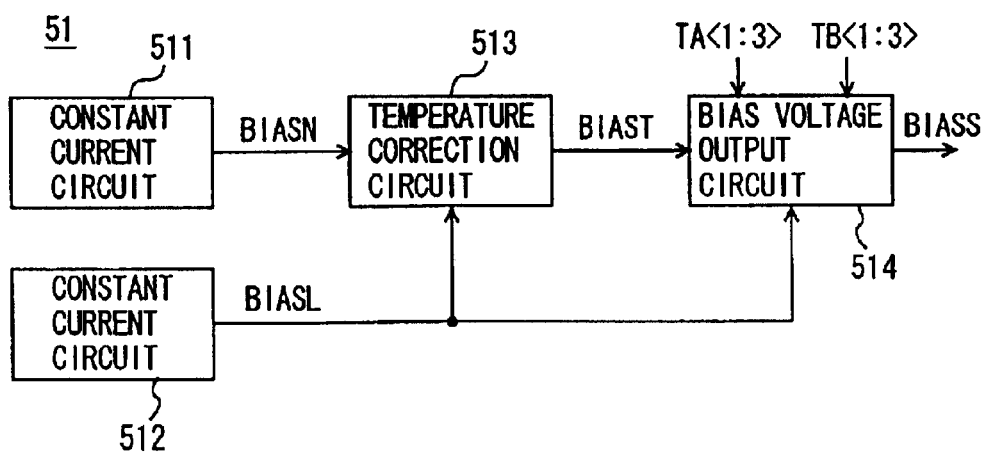
FIG. 3 is a functional block diagram illustrating functions of a voltage regulator in FIG. 2.

FIG. 3 is a functional block diagram illustrating functions of voltage regulator 51 in FIG. 2. Referring to FIG. 3, voltage regulator 51 includes constant current circuits 511, 512, a temperature correction circuit 513, and a bias voltage output circuit 514.

Constant current circuit 511 includes a highly temperature-dependent resistor, and generates a highly temperature-dependent voltage BIASN for output to temperature correction circuit 513. More specifically, constant current circuit 511 increases voltage BIASN with reduction in temperature.

Constant current circuit 512 includes a less temperature-dependent resistor. Constant current circuit 512 generates a voltage BIASL that is less temperature dependent than voltage BIASN, and outputs voltage BIASL to temperature correction circuit 513 and bias voltage output circuit 514. As described later, voltages BIASN, BIASL are used to generate bias voltage BIASS, and refresh cycle PHYS is determined according to bias voltage BIASS. The temperature dependence of voltage BIASL is so small that it does not affect refresh cycle PHYS. Therefore, the following description will be given on the assumption that voltage BIASL has no temperature dependence.

Temperature correction circuit 513 generates a voltage BIAST having positive temperature characteristics based on voltages BIASN, BIASL output from constant current circuits 511, 512, respectively, and outputs voltage BIAST to bias voltage output circuit 514. The "positive temperature characteristics" as used herein means that the voltage increases with increase in temperature.

Bias voltage output circuit 514 generates bias voltage BIASS based on voltages BIAST, BIASL output from temperature correction circuit 513 and constant current circuit 512, respectively, and outputs bias voltage BIASS to ring oscillator 52. At a temperature higher than prescribed temperature Ta, bias voltage output circuit 514 outputs temperature-dependent bias voltage BIASS based on voltages BIAST, BIASL. At prescribed temperature Ta or less, bias voltage output circuit 514 outputs constant bias voltage BIASS based on voltage BIASL having no temperature dependence.

Bias voltage output circuit 514 is capable of regulating dependence of voltage BIAST on bias voltage BIASS according to regulating signals TA<1:3>. In other words, bias voltage output circuit 514 is capable of regulating the gradient of change in bias voltage BIASS relative to temperature according to regulating signals TA<1:3>. Bias voltage output circuit 514 is also capable of regulating constant bias voltage BIASS determined based on voltage BIASL having no temperature dependence, according to regulating signals TB<1:3>. In other words, bias voltage output circuit 514 is capable of regulating the magnitude of bias voltage BIASS corresponding to the maximum refresh operation cycle according to regulating signals TB<1:3>.

Figure 4:
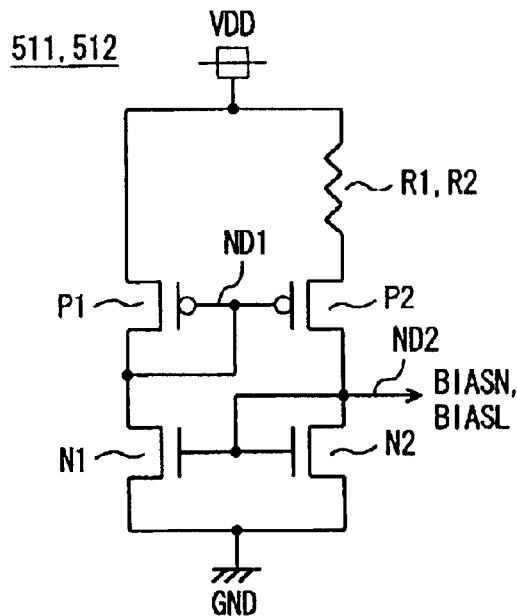
FIG. 4 is a circuit diagram showing the structure of a constant current circuit in FIG. 3.

FIG. 4 is a circuit diagram showing the structure of constant current circuit 511, 512 in FIG. 3. Referring to FIG. 4, constant current circuit 511 includes a resistor R1, P-channel MOS (Metal Oxide Semiconductor) transistors P1, P2, and N-channel MOS transistor N1, N2. Resistor R1 is connected between a power supply node VDD and P-channel MOS transistor P2. P-channel MOS transistor P1 is connected to power supply node VDD and node ND1, and has its gate connected to node ND1. N-channel MOS transistor N1 is connected to node ND1 and ground node GND, and has its gate connected to a node ND2. P-channel MOS transistor P2 is connected to resistor R1 and node ND2, and has its gate connected to node ND1. N-channel MOS transistor N2 is connected to node ND2 and ground node GND, and has its gate connected to node ND2.

Constant current circuit 512 has the same structure as that of constant current circuit 511 except that resistor R1 is replaced with a resistor R2.

Resistor R1 in constant current circuit 511 is a temperature-dependent resistor whose resistance value increases with increase in temperature. For example, resistor R1 is formed from an N-well. Hereinafter, operation of constant current circuit 511 will be described briefly. When the temperature is reduced, the resistance value of resistor R1 is reduced and thus a current Ia flowing across resistor R1 is increased. This increases the voltage on node ND2 and the gate voltage of N-channel MOS transistor N1, and thus reduces the voltage on node ND1. Accordingly, current Ia further increases, and voltage BIASN on node ND2 increases to a value higher than before the temperature is reduced.

Resistor R2 in constant current circuit 512 is a less temperature-dependent resistor. For example, resistor R2 is formed from polysilicon. The resistance value of resistor R2 hardly varies in response to change in temperature. Therefore, constant current circuit 512 outputs approximately constant voltage BIASL regardless of temperature.

As described later, resistor R1 is regulated to have the same resistance value as that of resistor R2 at prescribed temperature Ta.

Figure 5:
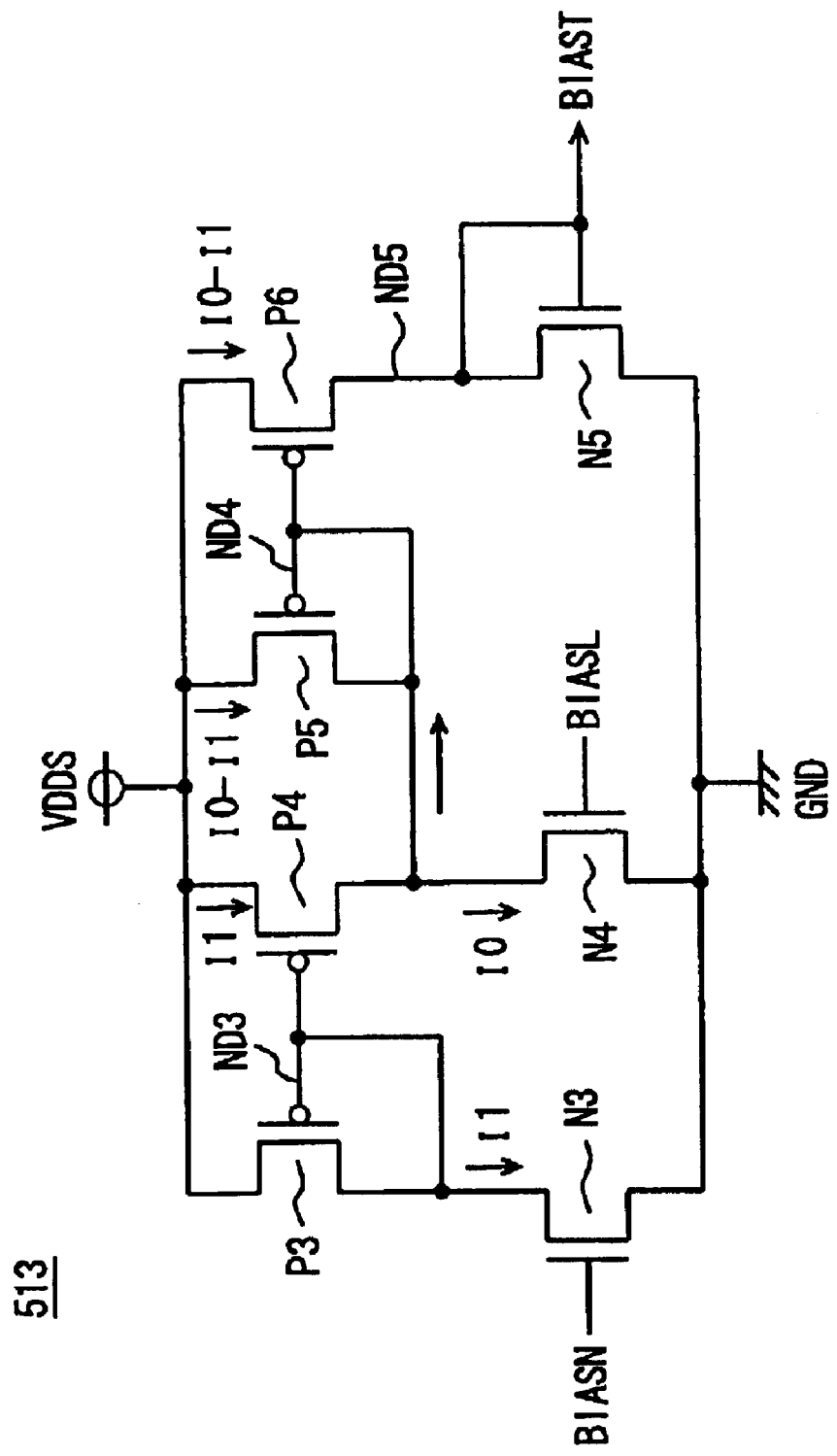
FIG. 5 is a circuit diagram showing the structure of a temperature correction circuit in FIG. 3.

FIG. 5 is a circuit diagram showing the structure of temperature correction circuit 513 in FIG. 3. Referring to FIG. 5, temperature correction circuit 513 includes P-channel MOS transistors P3, P4, P5, P6 and N-channel MOS transistors N3, N4, N5. P-channel MOS transistor P3 is connected to an internal power supply node VDDS and a node ND3, and has its gate connected to node ND3. N-channel MOS transistor N3 is connected to node ND3 and ground node GND, and receives voltage BIASN from constant current circuit 511 at its gate. P-channel MOS transistor P4 is connected to internal power supply node VDDS and node ND4, and has its gate connected to node ND3. N-channel MOS transistor N4 is connected to node ND4 and ground node GND, and receives voltage BIASL from constant current circuit 512 at its gate. P-channel MOS transistor P5 is connected to internal power supply node VDDS and node ND4, and has its gate connected to node ND4. P-channel MOS transistor P6 is connected to internal power supply node VDDS and node ND5, and has its gate connected to node ND4. N-channel MOS transistor N5 is connected to node ND5 and ground node GND, and has its gate connected to node ND5.

The voltage supplied from internal power supply node VDDS is a constant voltage resulting from down-converting an external power supply voltage by a not-shown voltage down-converter. This constant voltage is a stable voltage that is less susceptible to variation.

P-channel MOS transistors P3, P4 and N-channel MOS transistors N3, N4 form a current mirror differential amplifier. P-channel MOS transistors P5, P6 and N-channel MOS transistors N4, N5 form a current mirror differential amplifier.

Provided that N-channel MOS transistors N4, N3 have a drain current I0, I1, respectively, P-channel MOS transistor P4 has a drain current I1. Therefore, P-channel MOS transistor P5 receives a current equal to the difference between drain currents I0, I1 of N-channel MOS transistor N4 and P-channel MOS transistor P4, that is, a current (I0-I1). As a result, P-channel MOS transistor P6 receives a drain current (I0-I1).

Hereinafter, operation of temperature correction circuit 513 will be described briefly. When the temperature is reduced, voltage BIASN from constant current circuit 511 is increased and thus current I1 is increased. As a result, drain current (I0-I1) of P-channel MOS transistor P5 is reduced and thus drain current (I0-I1) of P-channel MOS transistor P6 is also reduced accordingly. With reduction in drain current (I0-I1) of P-channel MOS transistor P5, the voltage on node ND4 is increased and thus the gate voltage of P-channel MOS transistor P6 is increased accordingly. Voltage BIAST on node ND5 is thus reduced with reduction in temperature. In other words, temperature correction circuit 513 has positive temperature characteristics.

Figure 6:
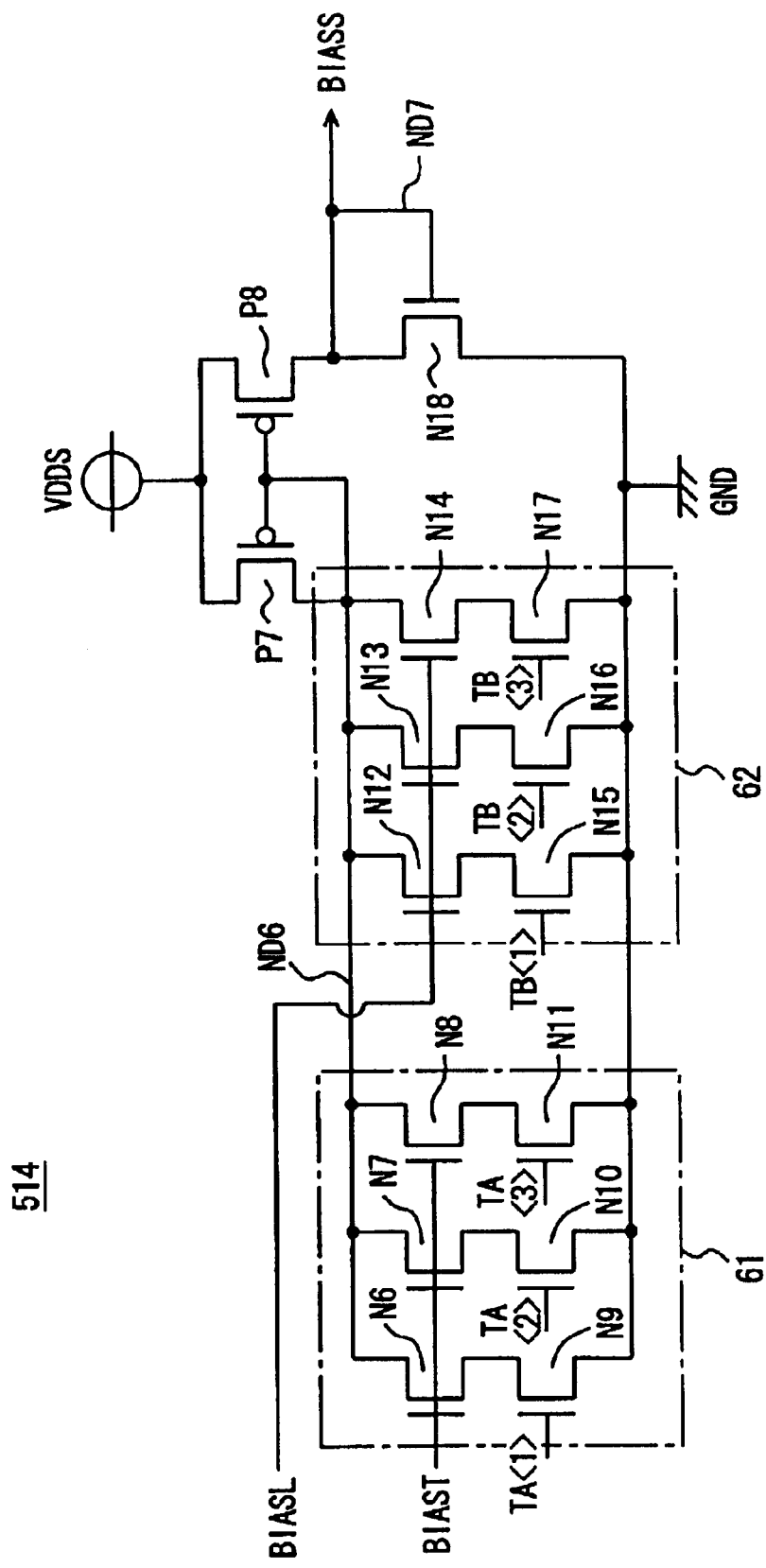
FIG. 6 is a circuit diagram showing the structure of a bias voltage output circuit in FIG. 3.

FIG. 6 is a circuit diagram showing the structure of bias voltage output circuit in FIG. 3. Referring to FIG. 6, bias voltage output circuit 514 includes P-channel MOS transistors P7, P8, an N-channel MOS transistor N18, and regulating units 61, 62. P-channel MOS transistor P7 is connected to internal power supply node VDDS and node ND6, and has its gate connected to node ND6. P-channel MOS transistor P8 is connected to internal power supply node VDDS and node ND7, and has its gate connected to node ND6. N-channel MOS transistor N18 is connected to node ND7 and ground node GND, and has its gate connected to node ND7.

Regulating unit 61 includes N-channel MOS transistors N6, N7, N8, N9, N10, N11. N-channel MOS transistor N6 is connected to node ND6 and N-channel MOS transistor N9, and receives voltage BIAST from temperature correction circuit 513 at its gate. N-channel MOS transistor N9 is connected to N-channel MOS transistor N6 and ground node GND, and receives a regulating signal TA<1> at its gate. N-channel MOS transistor N7 is connected to node ND6 and N-channel MOS transistor N10, and receives voltage BIAST at its gate. N-channel MOS transistor N10 is connected to N-channel MOS transistor N7 and ground node GND, and receives a regulating signal TA<2> at its gate. N-channel MOS transistor N8 is connected to node ND6 and N-channel MOS transistor N11, and receives voltage BIAST at its gate. N-channel MOS transistor N11 is connected to N-channel MOS transistor N8 and ground node GND, and receives a regulating signal TA<3> at its gate.

Regulating unit 62 includes N-channel MOS transistors N12, N13, N14, N15, N16, N17. N-channel MOS transistor N12 is connected to node ND6 and N-channel MOS transistor N15, and receives voltage BIASL from constant current circuit 512 at its gate. N-channel MOS transistor N15 is connected to N-channel MOS transistor N12 and ground node GND, and receives a regulating signal TB<1> at its gate. N-channel MOS transistor N13 is connected to node ND6 and N-channel MOS transistor N16, and receives voltage BIASL at its gate. N-channel MOS transistor N16 is connected to N-channel MOS transistor N13 and ground node GND, and receives a regulating signal TB<2> at its gate. N-channel MOS transistor N14 is connected to node ND6 and N-channel MOS transistor N17, and receives voltage BIASL at its gate. N-channel MOS transistor N17 is connected to N-channel MOS transistor N14 and ground node GND, and receives a regulating signal TB<3> at its gate.

Bias voltage output circuit 514 has the structure of a current mirror differential amplifier. The amount of current flowing through regulating units 61, 62 determines a drain current I2 of N-channel MOS transistor N18 and an output voltage of bias voltage output circuit 514, that is, bias voltage BIASS.

Regulating unit 61 is provided in order to regulate the temperature gradient of bias voltage BIASS. When the temperature is reduced, voltage BIAST from temperature correction circuit 513 and thus the gate voltage of N-channel MOS transistors N6 to N8 are reduced. The amount of current flowing through regulating unit 61 is therefore reduced accordingly. As a result, drain current I2 and thus bias voltage BIASS are reduced.

Regulating unit 61 has N-channel MOS transistors N9 to N11 in order to regulate the amount of current in regulating unit 61 by regulating signals TA<1:3>. More specifically, as the number of L-level (logic low) regulating signals TA<1:3> is increased, the current flowing through regulating unit 61 is reduced and therefore the influence of a change in voltage BIAST on bias voltage BIASS is relatively reduced. Accordingly, the temperature gradient of bias voltage BIASS is reduced as the number of L-level regulating signal TA<1:3> is increased.

Regulating unit 62 is provided in order to determine bias voltage BIASS corresponding to the maximum refresh operation cycle. But for regulating unit 62, the amount of current flowing through regulating unit 61 would be significantly reduced if the temperature is excessively reduced. As a result, bias voltage BIASS is reduced to an extremely small value. In response to reduction in bias voltage BIASS, ring oscillator 52 generates pulse signal PHY0 with an increased cycle. Accordingly, the cycle of refresh signal PHYS is unnecessarily increased, resulting in refresh-over.

Regulating unit 62 assures a current for generating the minimum bias voltage BIASS that ensures the maximum refresh operation cycle even if the amount of current flowing through regulating circuit 61 is reduced to zero (at prescribed temperature Ta or less, voltage BIAST falls to zero and therefore the amount of current flowing through regulating unit 61 is reduced to zero).

More specifically, voltage BIASL, that is, the gate voltage of N-channel MOS transistors N12 to N14 in regulating current 62, is less temperature dependent, and an approximately constant current flows through regulating unit 62. This constant current is regulated by regulating signals TB<1:3> so as to correspond to the minimum bias voltage BIASS that ensures the maximum refresh operation cycle.

At a temperature higher than prescribed temperature Ta, bias voltage output circuit 514 outputs bias voltage BIASS having a temperature gradient regulated by regulating unit 61. At prescribed temperature Ta or less, bias voltage output circuit 514 constantly outputs the minimum bias voltage BIASS that ensures the maximum refresh operation cycle.

Figure 7:
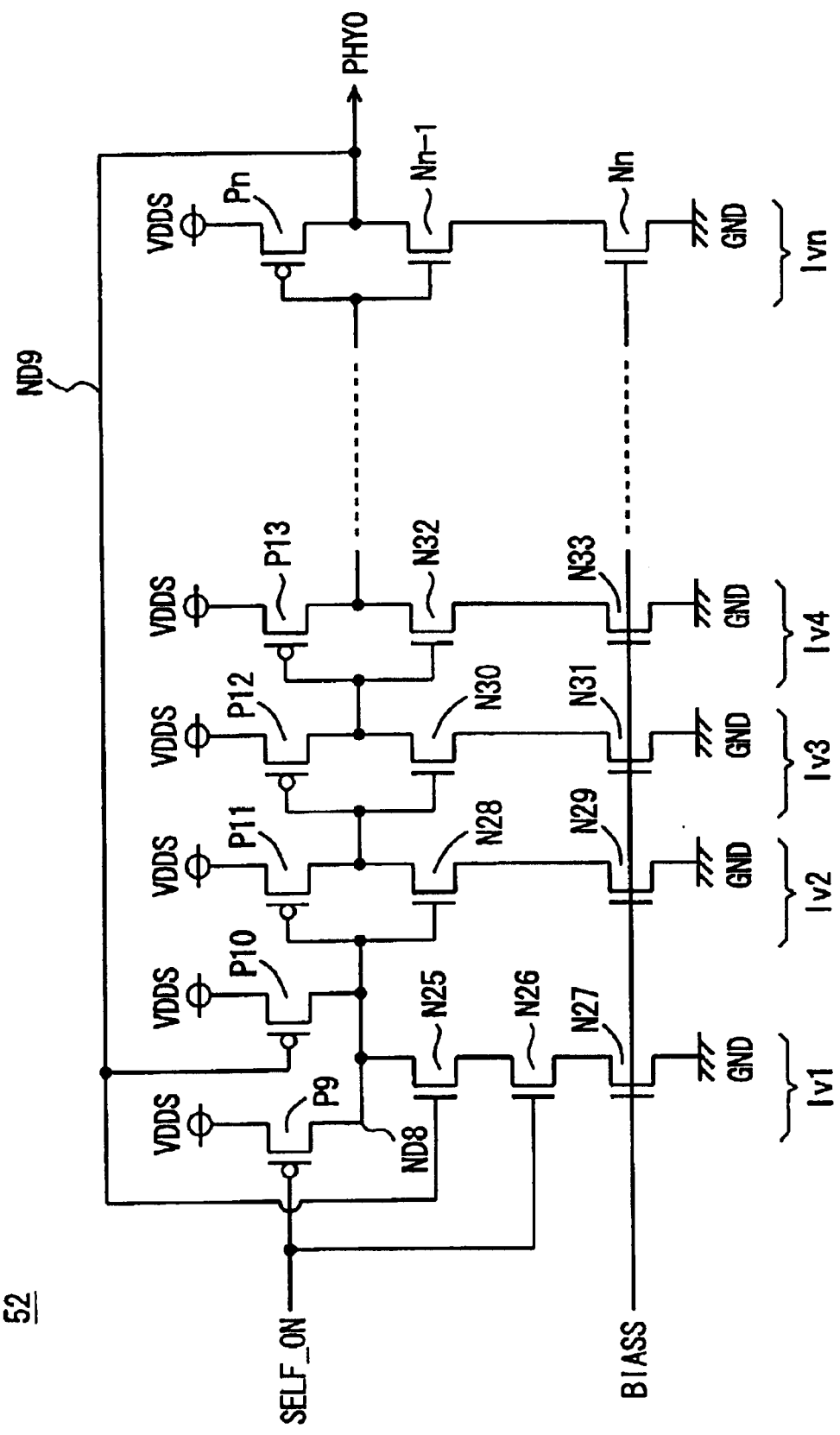
FIG. 7 is a circuit diagram showing the structure of a ring oscillator in FIG. 2.

FIG. 7 is a circuit diagram showing the structure of ring oscillator 52 in FIG. 2. Referring to FIG. 7, ring oscillator 52 includes a P-channel MOS transistor P9 and an odd number of inverters Iv1 to Ivn (where n is an odd number). P-channel MOS transistor P9 is connected to internal power supply node VDDS and node ND8, and receives self-refresh activation signal SELF_ON at its gate.

Inverter Iv1 includes a P-channel MOS transistor P10 and N-channel MOS transistors N25, N26, N27. P-channel MOS transistor P10 is connected to internal power supply node VDDS and node ND8, and receives the output of inverter Ivn at its gate. N-channel MOS transistor N25 is connected to node ND8 and N-channel MOS transistor N26, and receives the output of inverter Ivn at its gate. N-channel MOS transistor N26 is connected to N-channel MOS transistors N25, N27, and receives self-refresh activation signal SELF_ON at its gate. N-channel MOS transistor N27 is connected to N-channel MOS transistor N26 and ground node GND, and receives bias voltage BIASS from voltage regulator 51 at its gate.

Inverter Iv2 includes a P-channel MOS transistor P11 and N-channel MOS transistors N28, N29. P-channel MOS transistor P11 is connected to internal power supply node VDDS and N-channel MOS transistor N28, and receives the output of inverter Iv1 at its gate. N-channel MOS transistor N28 is connected to P-channel MOS transistor P11 and N-channel MOS transistor N29, and receives the output of inverter Iv1 at its gate. N-channel MOS transistor N29 is connected to N-channel MOS transistor N28 and ground node GND, and receives bias voltage BIASS at its gate.

Like inverter Iv2, inverters Iv3 to Ivn each includes a P-channel MOS transistor and an N-channel MOS transistor which receive the output of the inverter in the previous stage at their gates, and an N-channel MOS transistor that receives bias voltage BIASS at its gate.

In ring oscillator 52, inverters Iv1 to Ivn are connected like a ring. Self-refresh activation signal SELF_ON is a signal that is retained at H (logic high) level during self-refresh operation. When self-refresh activation signal SELF_ON is at H level, inverters Iv1 to Ivn operate and pulse signal PHY0, the output of inverter Ivn, is oscillated periodically. On the other hand, when self-refresh activation signal SELF_ON is at L level, P-channel MOS transistor P9 continuously pulls up node ND8 to H level, and inverter Ivn continuously outputs H-level pulse signal PHY0. In other words, ring oscillator 52 is inactivated.

Each inverter Iv1 to Ivn includes an N-channel MOS transistor that receives bias voltage BIASS from voltage regulator 51 at its gate. As bias voltage BIASS is reduced, the operation speed of each inverter Iv1 to Ivn is reduced. Accordingly, the oscillation cycle of pulse signal PHY0 is increased with reduction in bias voltage BIASS.

Figure 8:
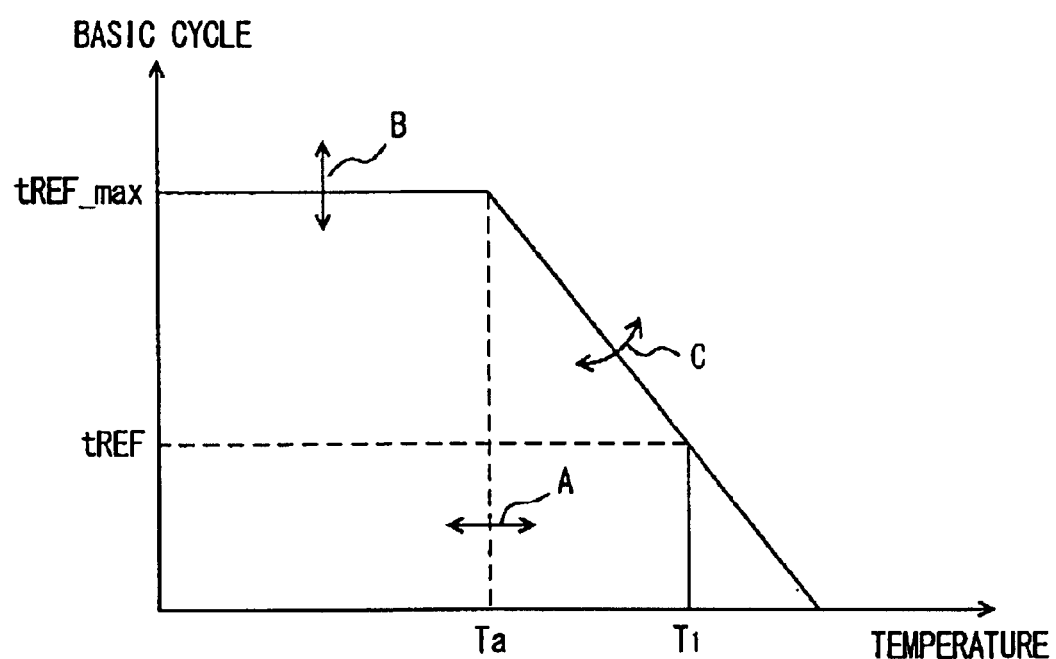
FIG. 8 shows temperature dependence of a refresh cycle determined by the refresh timer.

FIG. 8 illustrates temperature dependence of the refresh cycle determined by refresh timer 38. Referring to FIG. 8, at a temperature higher than temperature Ta, refresh cycle tREF is increased with reduction in temperature. At temperature Ta or less, the refresh cycle is retained at the maximum value tREF_max. It is herein assumed that temperature Ta is about room temperature. Hereinafter, a method for regulating refresh timer 38 will be described.

(1) Regulation of resistor R1 in constant current circuit 511 ("A" in FIG. 8)

First, resistor R1 is regulated to have the same resistance value as that of resistor R2 in constant current circuit 512 at temperature Ta. The reason for this is as follows: provided that the temperature is reduced and the resistance value of resistor R1 becomes equal to that of resistor R2 at temperature Ta. In this case, output voltage BLAST of temperature correction circuit 513 and thus the current flowing through regulating unit 61 in bias voltage output circuit 514 are reduced to zero. Therefore, at temperature Ta, bias voltage BIASS becomes the minimum voltage determined by regulating circuit 62. The maximum refresh cycle tREF_max is thus retained at temperature Ta or less.

Temperature Ta is desirably about room temperature. However, like normal operation, the regulating operation is commonly conducted at high temperature (about 80° C.). Therefore, the resistance value of resistor R1 is regulated in view of variation in resistance value of resistor R1 caused when the temperature changes from temperature in the regulating operation to room temperature.

(2) Regulation of maximum refresh cycle tREF_max at low temperature ("B" in FIG. 8)

Maximum refresh cycle tREF_max that is retained at a constant value at temperature Ta or less is regulated according to the possible data holding time in a memory cell of semiconductor memory device 10. Regulation is conducted as follows: in test mode, every regulating signal TA<1:3> is rendered at L level in order to inactivate temperature-dependent regulating unit 61 of bias voltage output circuit 514. Bias voltage BIASS is then regulated by regulating signals TB<1:3> and the refresh cycle is measured.

(3) Regulation of temperature gradient ("C" in FIG. 8)

The temperature gradient shown by "C" in FIG. 8 is regulated according to the target refresh cycle at high temperature (e.g., 80° C. that is close to the temperature during operation). Regulation is conducted as follows: bias voltage BIASS is regulated by regulating signals TA<1:3> in regulating unit 61 of bias voltage output circuit 514 so that a desired refresh cycle is obtained at a prescribed temperature. The refresh cycle is then measured.

In the case where semiconductor memory device 10 has a temperature-compensating self-refresh function by EMRS (Extended Mode Resister Set), bias voltage output circuit 514 is replaced with bias voltage output circuit 514A in order to prevent interference with this function.

In temperature-compensating self-refresh operation by EMRS, semiconductor memory device 10 is capable of varying the refresh cycle in response to a command applied thereto. For example, semiconductor memory device 10 has four temperature modes: 85° C., 70° C., 40° C. and 15° C. Provided that the refresh cycle is 1 in 70° C. mode, the refresh cycle can be set to ½ in 85° C. mode, twice in 40° C. mode, and four times in 15° C. mode.

In semiconductor memory device 10 of the present invention, however, refresh timer 38 automatically regulates the refresh cycle. Therefore, if the temperature-compensating self-refresh function by EMRS is active, the refresh cycle would be unnecessarily increased at low temperature. In order to prevent such a problem, the self temperature compensating function of voltage regulator 51 is inactivated while the temperature-compensating self-refresh function by EMRS is active.

Figure 9:
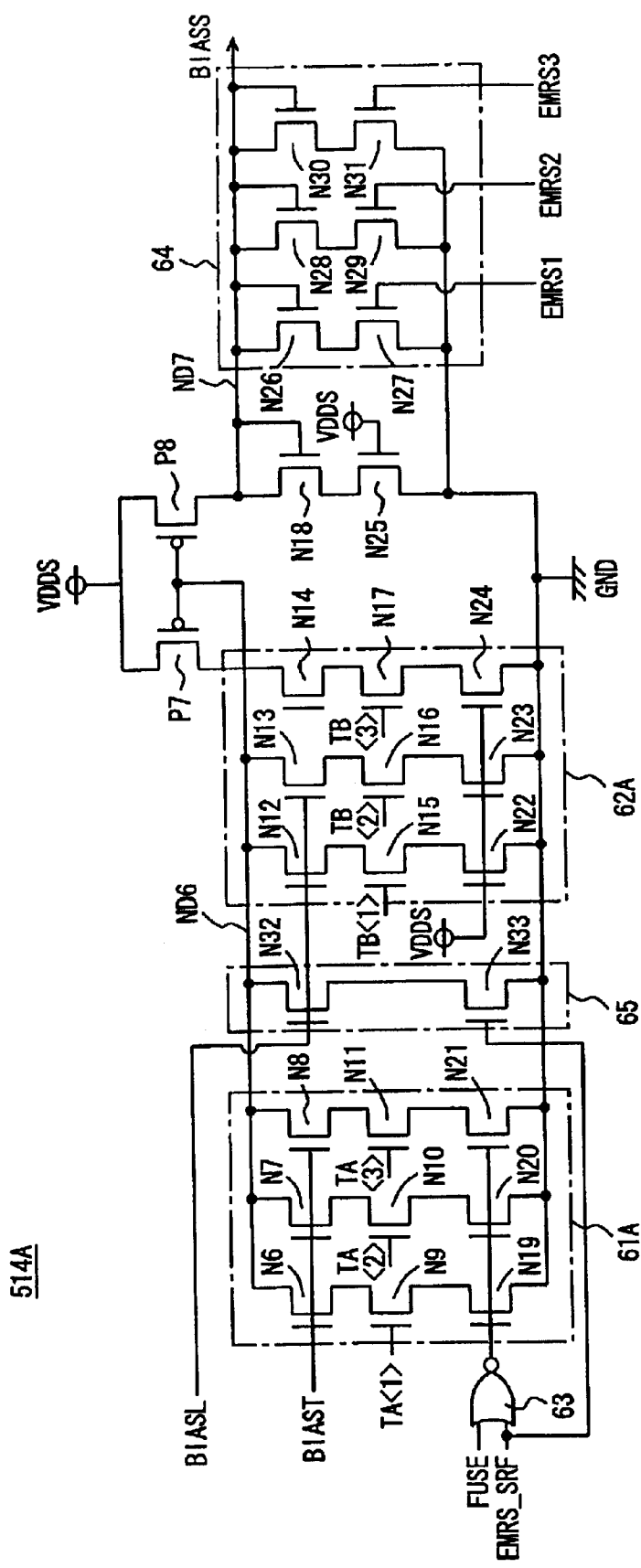
FIG. 9 is a circuit diagram showing another structure of the bias voltage output circuit.

FIG. 9 is a circuit diagram showing the structure of the bias voltage output circuit that is capable of inactivating the self temperature compensating function of the present invention while the temperature-compensating self-refresh function by EMRS is active. Referring to FIG. 9, in bias voltage output circuit 514A, regulating units 61, 62 in bias voltage output circuit 514 are replaced with regulating units 61A, 62A. In addition to the elements of bias voltage output circuit 514, bias voltage output circuit 514A includes a NOR gate 63, an EMRS setting unit 64, an EMRS correcting unit 65, and an N-channel MOS transistor N25. N-channel MOS transistor N25 is connected to N-channel MOS transistor N18 and ground node GND, and has its gate connected to internal power supply node VDDS.

EMRS setting unit 64 includes N-channel MOS transistors N26, N27, N28, N29, N30, N31. N-channel MOS transistor N26 is connected to node ND7 and N-channel MOS transistor N27, and has its gate connected to node ND7. N-channel MOS transistor N27 is connected to N-channel MOS transistor N26 and ground node GND, and receives a signal EMRS1 at its gate. N-channel MOS transistor N28 is connected to node ND7 and N-channel MOS transistor N29, and has its gate connected to node ND7. N-channel MOS transistor N29 is connected to N-channel MOS transistor N28 and ground node GND, and receives a signal EMRS2 at its gate. N-channel MOS transistor N30 is connected to node ND7 and N-channel MOS transistor N31, and has its gate connected to node ND7. N-channel MOS transistor N31 is connected to N-channel MOS transistor N30 and ground node GND, and receives a signal EMRS3 at its gate.

EMRS setting unit 64 is a circuit for implementing the above temperature-compensating self-refresh function by EMRS. Each signal EMRS1 to EMRS3 goes to H or L level according to the above four temperature modes. Signals EMRS1 to EMRS3 go to H level in 85° C. mode. Signals EMRS1, EMRS2 go to H level in 70° C. mode. Signal EMRS1 goes to H level in 40° C. mode. Signals EMRS1 to EMRS3 go to L level in 15° C. mode. As the temperature mode is reduced, bias voltage BIASS is reduced and the refresh cycle is increased.

NOR gate 63 receives a signal FUSE and an EMRS mode signal EMRS_SRF. Signal FUSE is output from a not-shown fuse circuit. When the self temperature compensating function of the present invention is not used, signal FUSE is rendered at H level by blowing a fuse element in the fuse circuit. EMRS mode signal EMRS_SRF goes to H level when at least one of signals EMRS1 to EMRS3 is at H level. Signal FUSE and EMRS mode signal EMRS_SRF are both activated when the self temperature compensating function of the present invention is not used.

In addition to the elements of regulating unit 61, regulating unit 61A includes N-channel MOS transistors N19 to N21 which receive the output of NOR gate 63 at their gates. In addition to the elements of regulating unit 62, regulating unit 62A includes N-channel MOS transistors N22 to N24 having their gates connected to internal power supply node VDDS.

In regulating unit 61A, the output of NOR gate 63 falls to L level in response to activation of either signal FUSE or EMRS mode signal EMRS_SRF. As a result, N-channel MOS transistors N19 to N21 are turned OFF, and regulating unit 61A is inactivated. Bias voltage output circuit 514A thus inactivates the self temperature compensating function of the present invention.

Note that N-channel MOS transistors N22 to N24 in regulating unit 62A are provided corresponding to N-channel MOS transistors N19 to N21 in regulating unit 61A. In other words, N-channel MOS transistors N22 to N24 are provided in view of the balance of current in regulating circuits 61A, 62A. Since N-channel MOS transistors N22 to N24 are turned ON with their gates connected to internal power supply node VDDS, regulating unit 62A has the same function as that of regulating unit 62.

EMRS correcting unit 65 includes N-channel MOS transistors N32, N33. N-channel MOS transistor N32 is connected to node ND6 and N-channel MOS transistor N33, and receives voltage BIASL at its gate. N-channel MOS transistor N33 is connected to N-channel MOS transistor N32 and ground node GND, and receives EMRS mode signal EMRS_SRF at its gate.

EMRS correcting unit 65 corrects bias voltage BIASS at high temperature (e.g., 80° C. that is close to the temperature during operation, as described above) when regulating unit 61A is inactivated. In other words, when regulating unit 61A is inactivated, a current flowing through regulating unit 61A is cut off. In this case, a current flowing through regulating unit 61A at high temperature is also cut off, whereby bias voltage BIASS at high temperature is reduced. Therefore, correction of bias voltage BIASS is required in order to ensure refresh operation at high temperature. EMRS correcting unit 65 is designed so that the same amount of current as that flowing through regulating unit 61A at high temperature flows trough EMRS correcting unit 65. When EMRS mode signal EMRS_SRF goes to H level, regulating unit 61A is inactivated and N-channel MOS transistor N33 in EMRS correcting unit 65 is turned ON. EMRS correcting unit 65 thus compensates for the amount of current flowing through regulating unit 61A at high temperature. This ensures refresh operation at high temperature even when temperature-compensating self-refresh operation by EMRS is conducted.

Note that, in the above description, regulating units 61, 62 of bias voltage output circuit 514 or regulating units 61A, 62A of bias voltage output circuit 514A each includes three N-channel MOS transistors for regulation. However, the present invention is not limited to this, and each regulating unit 61, 62, 61A, 62A may include any number of N-channel MOS transistors for regulation.

As has been described above, semiconductor memory device 10 of the first embodiment includes refresh timer 38 having positive temperature characteristics. This enables refresh operation to be conducted with an appropriate refresh cycle from high temperature to low temperature.

Semiconductor memory device 10 of the first embodiment includes bias voltage output circuit 514, 514A capable of regulating the temperature gradient of the refresh cycle that varies depending on the temperature. This enables the refresh cycle to be appropriately regulated from high temperature to low temperature.

Bias voltage output circuits 514, 514A are capable of regulating the maximum refresh operation cycle at low temperature. This enables the refresh cycle to be appropriately regulated according to the data holding capability of the memory cells.

Semiconductor memory device 10 of the first embodiment includes bias voltage output circuit 514A for preventing interference with the temperature-compensating self-refresh operation by EMRS. As a result, the self temperature compensating self-refresh function of the present invention will not interfere with the temperature-compensating self-refresh function by EMRS, enabling refresh operation to be conducted with an appropriate refresh cycle by either function.

Second Embodiment

The semiconductor memory device of the second embodiment has a test mode in which the semiconductor memory device is capable of easily measuring the refresh cycle of the self-refresh operation.

Figure 10:
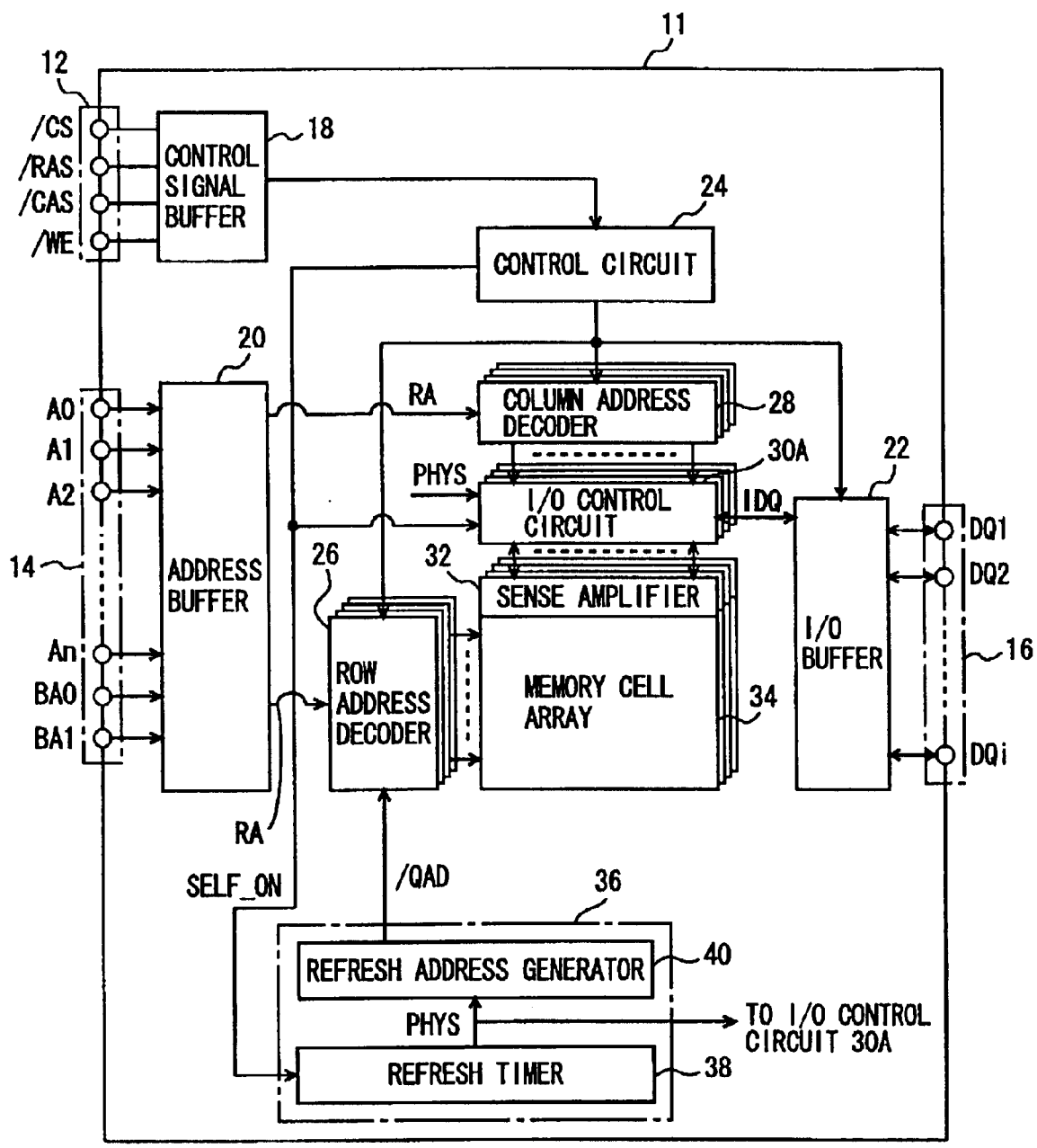
FIG. 10 is a schematic block diagram showing the overall structure of a semiconductor memory device according to a second embodiment of the present invention.

FIG. 10 is a schematic block diagram showing the overall structure of the semiconductor memory device according to the second embodiment of the present invention. Referring to FIG. 10, semiconductor memory device 11 is different from semiconductor memory device 10 of the first embodiment in FIG. 1 in that I/O control circuits 30 are replaced with I/O control circuits 30A.

I/O control circuit 30A receives a refresh signal PHYS from refresh timer 38 of refresh control circuit 36, and signals TM_MONI, TMPHYS and a pulse signal MONI_DRV from control circuit 24. As described in the first embodiment, refresh signal PHYS is activated in every refresh cycle. Signal TM_MONI is activated when semiconductor memory device 11 enters the test mode for measuring the self-refresh cycle. Signal TM_MONI is activated according to a command applied to semiconductor memory device 11. Note that this command is a specific command (MRS: Mode Resister Set) that is not applied in normal operation. This command is set through the existing prescribed terminal. Semiconductor memory device 11 enters the test mode for measuring the self-refresh cycle, in response to the command.

Signal TMPHYS is activated when measurement of the refresh cycle is started. Signal TMPHYS is activated if a prescribed signal is set to a specific address terminal in response to the above specific command (MRS). Refresh timer 38 starts counting the refresh cycle in response to activation of signal TMPHYS. Pulse signal MONI_DRV is a one-shot pulse signal that is activated if a READ command is applied while signals TM_MONI, TMPHYS are active.

When signal TMPHYS from control circuit 24 is activated, I/O control circuit 30A latches the first refresh signal PHYS received from refresh timer 38 after activation of signal TMPHYS. If I/O control circuit 30A has latched refresh signal PHYS when it receives pulse signal MONI_DRV from control circuit 24, it outputs an H-level signal to a not-shown data bus DB. If I/O control circuit 30A has not latched refresh signal PHYS, it outputs an L-level signal to data bus DB.

The signal thus output to data bus DB is transmitted to I/O buffer 22. I/O buffer 22 then outputs a signal according to the signal level to data I/O terminal 16.

The timing when I/O control circuit 30A latched the refresh signal can be known by shifting the timing of applying the READ command. Therefore, the refresh cycle can be measured by measuring the time from application of the command that activated signal TMPHYS.

Since the structure of semiconductor memory device 11 is otherwise the same as that of semiconductor memory device 10 of the first embodiment, description thereof will not be repeated.

Figure 11:
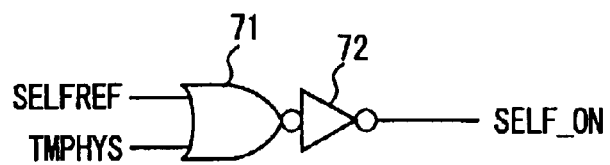
FIG. 11 is a circuit diagram showing the structure of a signal generator for generating a self-refresh activation signal, which is included in a control circuit in FIG. 10.

FIG. 11 is a circuit diagram showing the structure of a signal generator included in control circuit 24, for generating self-refresh activation signal SELF_ON to be applied to refresh timer 38.

Referring to FIG. 11, the signal generator includes a NOR gate 71 and an inverter 72. NOR gate 71 receives signals SELFREF, TMPHYS. Inverter 72 inverts the output of NOR gate 71 and outputs self-refresh activation signal SELF_ON.

In normal operation (the test mode is inactivated in normal operation), signal SELFREF goes to H level when semiconductor memory device 11 is in the self-refresh mode. As described above, signal TMPHYS goes to H level when measurement of the refresh cycle is started. In other words, in normal operation, signal SELFREF and self-refresh activation signal SELF_ON are retained at H level in the self-refresh mode. In the test mode for measuring the self-refresh cycle, however, signal SELFREF goes to L level. Signal TMPHYS goes to H level when measurement of the refresh cycle is started. As a result, self-refresh activation signal SELF_ON goes to H level.

In the test mode for measuring the self-refresh cycle, refresh timer 38 starts counting the refresh cycle in response to activation of signal TMPHYS.

Figure 12:
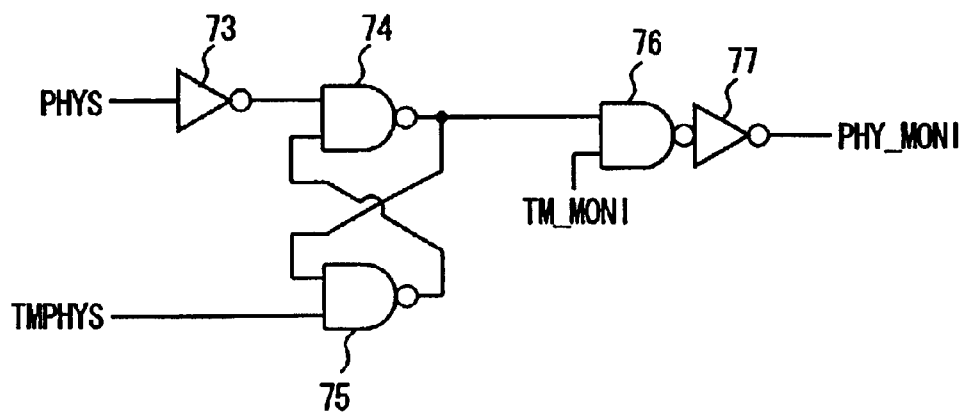
FIG. 12 is a circuit diagram showing the structure of a PHY_MONI signal generator included in an input/output (I/O) control circuit in FIG. 10.

FIG. 12 is a circuit diagram showing the structure of a PHY_MONI signal generator included in I/O control circuit 30A of FIG. 10.

Referring to FIG. 12, the PHY_MONI signal generator includes inverters 73, 77 and NAND gates 74, 75, 76. Inverter 73 inverts refresh signal PHYS received from refresh timer 38. NAND gate 74 receives the respective outputs of inverter 73 and NAND gate 75. NAND gate 75 receives output signal TMPHYS of control circuit 24 and the output of NAND gate 74. NAND gate 76 receives output signal TM_MONI of control circuit 24 and the output of NAND gate 74. Inverter 77 inverts the output of NAND gate 76 and outputs signal PHY_MONI.

NAND gates 74, 75 forms a latch circuit for latching the states of signal PHYS if signal PHYS rises to H level after signal TMPHYS rises to H level. When signal TM_MONI is at H level, NAND gate 76 outputs an L-level signal, and the PHY_MONI signal generator outputs signal PHY_MONI at H level.

Figure 13:
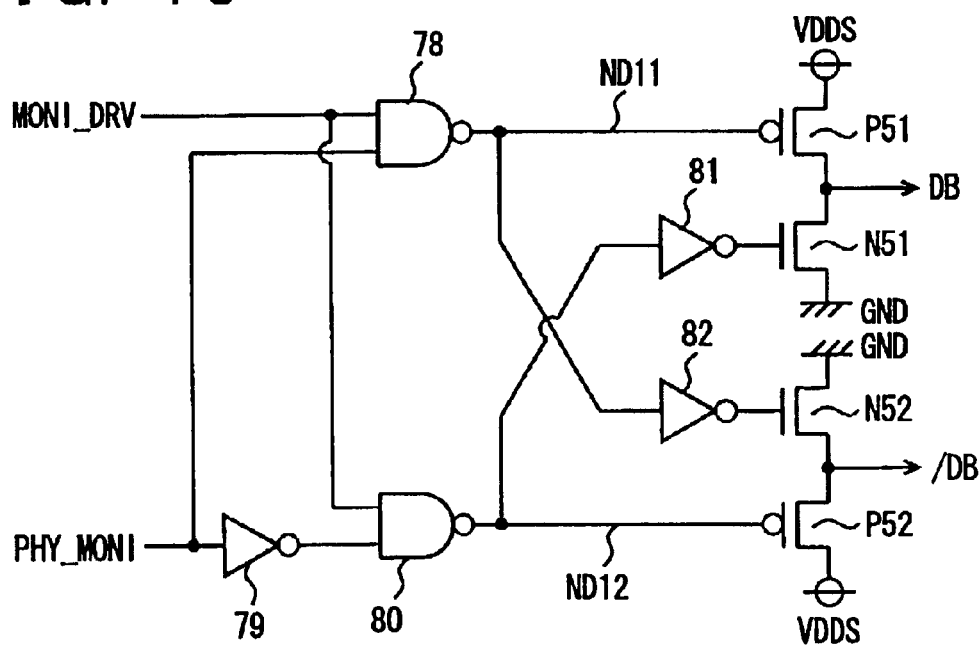
FIG. 13 is a circuit diagram showing the structure of a DB output circuit included in the I/O control circuit in FIG. 10.

FIG. 13 is a circuit diagram showing the structure of a DB output circuit included in I/O control circuit 30A in FIG. 10.

Referring to FIG. 13, the DB output circuit includes NAND gates 78, 80 and inverters 79, 81, 82. NAND gate 78 receives pulse signal MONI_DRV from control circuit 24 and signal PHY_MONI from the PHY_MONI signal generator. Inverter 79 inverts signal PHY_MONI. NAND gate 80 receives pulse signal MONI_DRV and the output of inverter 79. Inverter 81 inverts the output of NAND gate 80, and inverter 82 inverts the output of NAND gate 78.

The DB output circuit further includes P-channel MOS transistors P51, P52 and N-channel MOS transistors N51, N52. P-channel MOS transistor P51 is connected to internal power supply node VDDS and data bus DB, and has its gate connected to a node ND11, i.e., output node of NAND gate 78. N-channel MOS transistor N51 is connected to data bus DB and ground node GND, and receives the output of inverter 81 at its gate. P-channel MOS transistor P52 is connected to internal power supply node VDDS and data bus/DB, and has its gate connected to a node ND12, that is, output node of NAND gate 80. N-channel MOS transistor N52 is connected to data bus/DB and ground node GND, and receives the output of inverter 82 at its gate.

Hereinafter, operation of the DB output circuit will be described. When pulse signal MONI_DRV and signal PHY_MONI are both at L level, the signals at nodes ND11, ND12 are both at H level. Accordingly, P-channel MOS transistors P51, P52 and N-channel MOS transistors N51, N52 are turned OFF, and data buses DB, /DB are rendered in high impedance state.

If signal PHY_MONI then goes to H level and pulse signal MONI_DRV is applied, the signals at nodes ND11, ND12 respectively go to L level and H level in response to pulse signal MONI_DRV. Accordingly, P-channel MOS transistor P51 and N-channel MOS transistor N52 are turned ON, whereas P-channel MOS transistor P52 and N-channel MOS transistor N51 are turned OFF. As a result, H-level signal and L-level signal are output to data buses DB, /DB, respectively.

It is now assumed that pulse signal MONI_DRV and signal PHY_MONI are both at L level. If pulse signal MONI_DRV is applied before signal PHY_MONI goes to H level, the signals at nodes ND11, ND12 respectively go to H level and L level in response to pulse signal MONI_DRV. Accordingly, P-channel MOS transistor P51 and N-channel MOS transistor N52 are turned OFF, whereas P-channel MOS transistor P52 and N-channel MOS transistor N51 are turned ON. As a result, L-level signal and H-level signal are output to data buses DB, /DB, respectively.

Figure 14:
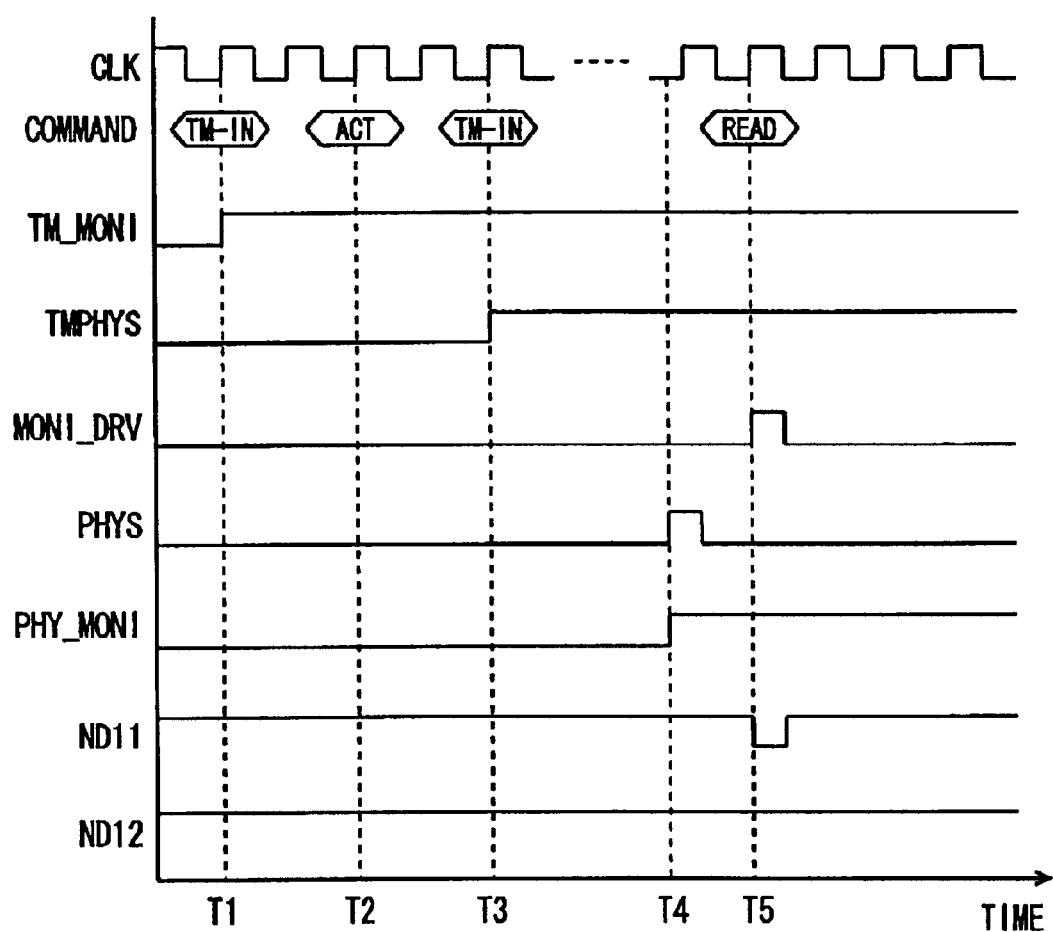
FIG. 14 is a first timing chart showing waveforms of main signals upon measuring a self-refresh cycle.
Figure 15:
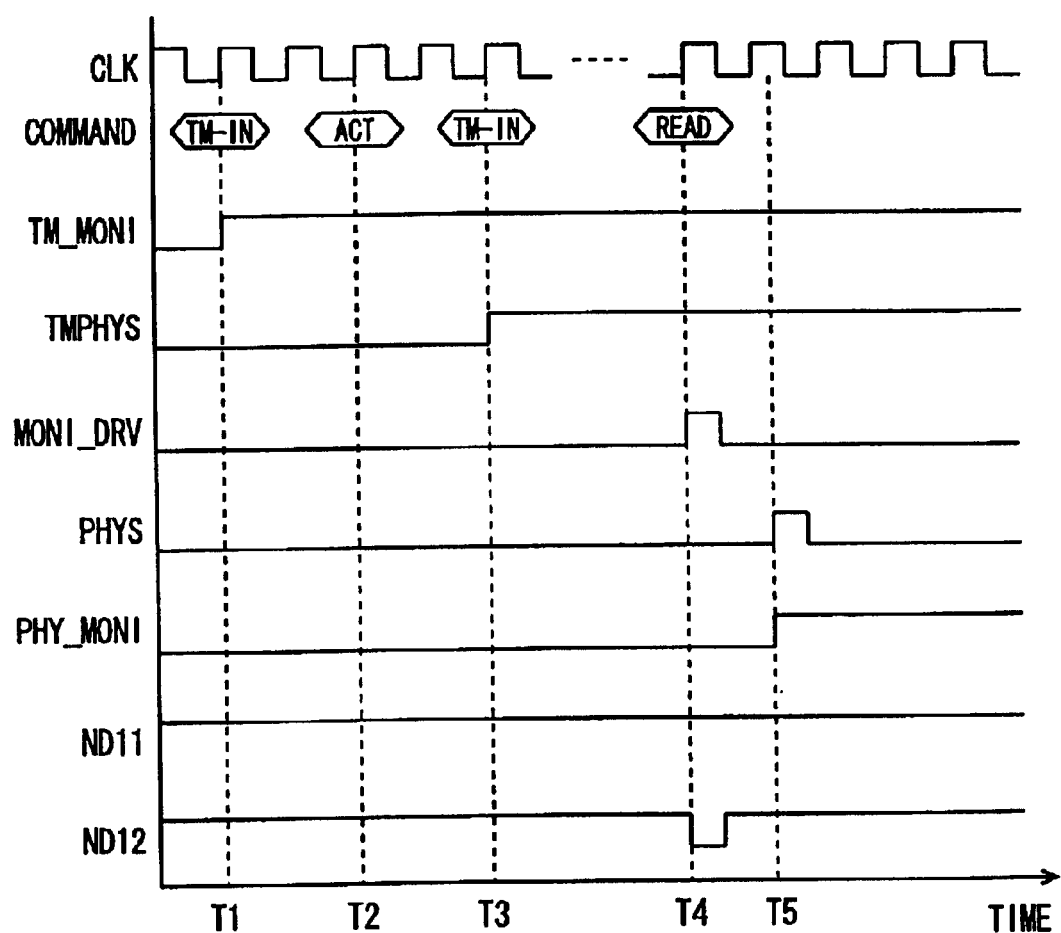
FIG. 15 is a second timing chart showing waveforms of main signals upon measuring a self-refresh cycle.

FIGS. 14, 15 are timing charts showing the waveforms of main signals upon measuring the self-refresh cycle in semiconductor memory device 11 of the second embodiment. FIG. 14 shows the case where pulse signal MONI_DRV is activated after signal PHY_MONI goes to H level. FIG. 15 shows the case where pulse signal MONI_DRV is activated before signal PHY_MONI goes to H level.

Referring to FIG. 14, semiconductor memory device 11 receives a TM-IN command at time T1. In response to the TM-IN command, semiconductor memory device 11 enters the test mode for measuring the self-refresh cycle and signal TM_MONI is activated to H level. Semiconductor memory device 11 receives an ACT command at time T2, and receives the TM-IN command again at time T3. In response to this, signal TMPHYS is activated to H level and measurement of the refresh cycle is started. More specifically, refresh timer 38 starts counting the refresh cycle.

Refresh timer 38 outputs refresh signal PHYS after the refresh cycle from time T3, that is, at time T4. In response to this, the PHY_MONI signal generator latches pulsed refresh signal PHYS and outputs signal PHY_MONI at H level.

Semiconductor memory device 11 receives a READ command at time T5. In response to this, control circuit 24 generates pulse signal MONI_DRV and the signal at node ND11 of the DB output circuit goes to L level. Accordingly, as described above, the DB output circuit outputs H-level signal and L-level signal to data buses DB, /DB, respectively, and H-level data is output from a prescribed terminal of data I/O terminal 16 in FIG. 10.

In the example of FIG. 15, the timing of applying the READ command is shifted. More specifically, measurement of the refresh cycle is started at time T3 in response to activation of signal TMPHYS. Refresh timer 38 outputs refresh signal PHYS after the refresh cycle from time T3, that is, at time T5. In this example, semiconductor memory device 11 receives the READ command at time T4, that is, before refresh timer 38 outputs refresh signal PHYS. In response to the READ command, control circuit 24 generates pulse signal MONI_DRV, and the signal at node ND12 of the DB output circuit goes to L level. Accordingly, as described above, the DB output circuit outputs L-level signal and H-level signal to data buses DB, /DB, respectively, and L-level data is output from a prescribed terminal of data I/O terminal 16 in FIG. 10.

The data read from the prescribed terminal of data I/O terminal 16 in response to the READ command have different logic levels before and after refresh timer 38 outputs refresh signal PHYS. Therefore, the refresh cycle can be measured by measuring the time between the TM-IN command and the READ command while gradually shifting the timing of applying the READ command, that is, by measuring the time between application of the TM-IN command, i.e., the timing the logic level of the data read from the prescribed terminal of data I/O terminal 16 is varied, and application of the READ command.

As has been described above, semiconductor memory device 11 of the second embodiment includes the PHY_MONI signal generator and the DB output circuit. The use of the PHY_MONI signal generator and the DB output circuit facilitates measurement of the refresh cycle.

Note that the semiconductor memory device of the first and second embodiments may either be of an asynchronous or synchronous type. The synchronous type includes a double-data-rate synchronous type.

Although the present invention has been described and illustrated in detail, it is clearly understood that the same is by way of illustration and example only and is not to be taken by way of limitation, the sprit and scope of the present invention being limited only by the terms of the appended claims.

What is claimed is:

1. A semiconductor memory device, comprising:
   a memory cell array including a plurality of memory cells arranged in a matrix; and
   a refresh control circuit periodically executing refresh operation in order to hold information stored in said plurality of memory cells, wherein
   said refresh control circuit includes
      a refresh timer determining a refresh cycle and generating a refresh signal in said refresh cycle, and
      a refresh address generator sequentially generating, in response to said refresh signal, a refresh row address designating a row of memory cells to be subjected to said refresh operation, and
   said refresh timer includes
      a voltage regulator regulating an output voltage according to reduction in temperature by using a differential amplifier,
      an oscillator receiving said output voltage from said voltage regulator and generating an internal signal whose generation cycle is increased with reduction in said output voltage, and
      a refresh signal generator generating said refresh signal based on said internal signal.

2. The semiconductor memory device according to claim 1, wherein said voltage regulator outputs a constant output voltage when a temperature is less than a prescribed value.

3. The semiconductor memory device according to claim 2, wherein
   said voltage regulator includes
      a first constant current circuit outputting a first voltage based on a resistance value of a first resistor having first temperature characteristics,
      a second constant current circuit outputting a second voltage based on a resistance value of a second resistor having positive second temperature characteristics that have a temperature gradient greater than that of said first resistor,
      a temperature correction circuit comparing said second voltage with said first voltage and outputting a third voltage having positive temperature characteristics based on the comparison result, and
      a bias voltage output circuit converting said third voltage for a match to temperature characteristics of said refresh cycle and outputting said output voltage.

4. The semiconductor memory device according to claim 3, wherein said bias voltage output circuit outputs said output voltage at minimum voltage corresponding to a maximum cycle of said refresh cycle when a temperature is less than said prescribed value.

5. The semiconductor memory device according to claim 3, wherein when the refresh cycle is preset from outside, said bias voltage output circuit outputs the output voltage corresponding to said preset refresh cycle.

6. A semiconductor memory device, comprising:
   a memory cell array including a plurality of memory cells arranged in a matrix;
   a refresh control circuit periodically executing refresh operation in order to hold information stored in said plurality of memory cells;
   a measuring circuit generating a measurement signal in response to a first command applied to said semiconductor memory device in a refresh cycle measuring mode; and
   an output circuit outputting said measurement signal to outside, wherein
   said refresh control circuit includes
      a refresh timer determining a refresh cycle and generating a refresh signal in said refresh cycle, and
      a refresh address generator sequentially generating, in response to said refresh signal, a refresh row address designating a row of memory cells to be subjected to said refresh operation,
   said refresh timer starts counting operation for generating said refresh signal in response to a second command applied to said semiconductor memory device in said refresh cycle measuring mode, and
   said measuring circuit receives said refresh signal that is generated by said refresh timer after said refresh cycle based on said second command, and said measuring circuit outputs said measurement signal having a first logic level to said output circuit when said measuring circuit receives said refresh signal before said first command, and outputs said measurement signal having a second logic level to said output circuit when said measuring circuit does not receive said refresh signal before said first command.

7. The semiconductor memory device according to claim 6, wherein
   said measuring circuit includes a measurement signal generator and a measurement signal output circuit,
   said measurement signal generator outputs to said measurement signal output circuit a monitor signal resulting from latching said refresh signal received from said refresh timer, and
   said measurement signal output circuit outputs said measurement signal having a logic level corresponding to that of said monitor signal to said output circuit in response to said first command.

* * * * *